United States Patent [19]

Douglas

[11] Patent Number: 4,980,020
[45] Date of Patent: Dec. 25, 1990

[54] LOCAL INTERCONNECT ETCH TECHNIQUE

[75] Inventor: Monte A. Douglas, Coppell, Tex.

[73] Assignee: Texas Instruments Incorporated, Dallas, Tex.

[21] Appl. No.: 455,469

[22] Filed: Jan. 22, 1989

[51] Int. Cl.⁵ .............. H01L 21/306; B44C 1/22; C23F 1/02; C03C 15/00
[52] U.S. Cl. .................. 156/643; 156/646; 156/652; 156/656; 156/657; 156/662; 156/659.1; 437/200
[58] Field of Search .............. 156/643, 646, 648, 652, 156/656, 657, 659.1, 662; 430/313, 317, 318; 357/23.1, 23.6, 23.9, 23.11, 65, 67; 437/29, 41, 56–59, 200

[56] References Cited

U.S. PATENT DOCUMENTS

| 4,675,073 | 6/1987 | Douglas | 156/643 |
| 4,713,358 | 12/1987 | Bulat et al. | 437/200 X |
| 4,793,896 | 12/1988 | Douglas | 156/643 |
| 4,863,559 | 9/1989 | Douglas | 156/643 |

Primary Examiner—William A. Powell
Attorney, Agent, or Firm—James C. Kesterson; James T. Comfort; Melvin Sharp

[57] ABSTRACT

The disclosure relates to a method of forming a local interconnect by using a fluorine-based etchant with selectivity to cobalt and/or titanium silicide for removing unmasked portions of an electrically conductive interconnect pattern which is connected to a region of cobalt or titanium silicide.

12 Claims, 1 Drawing Sheet

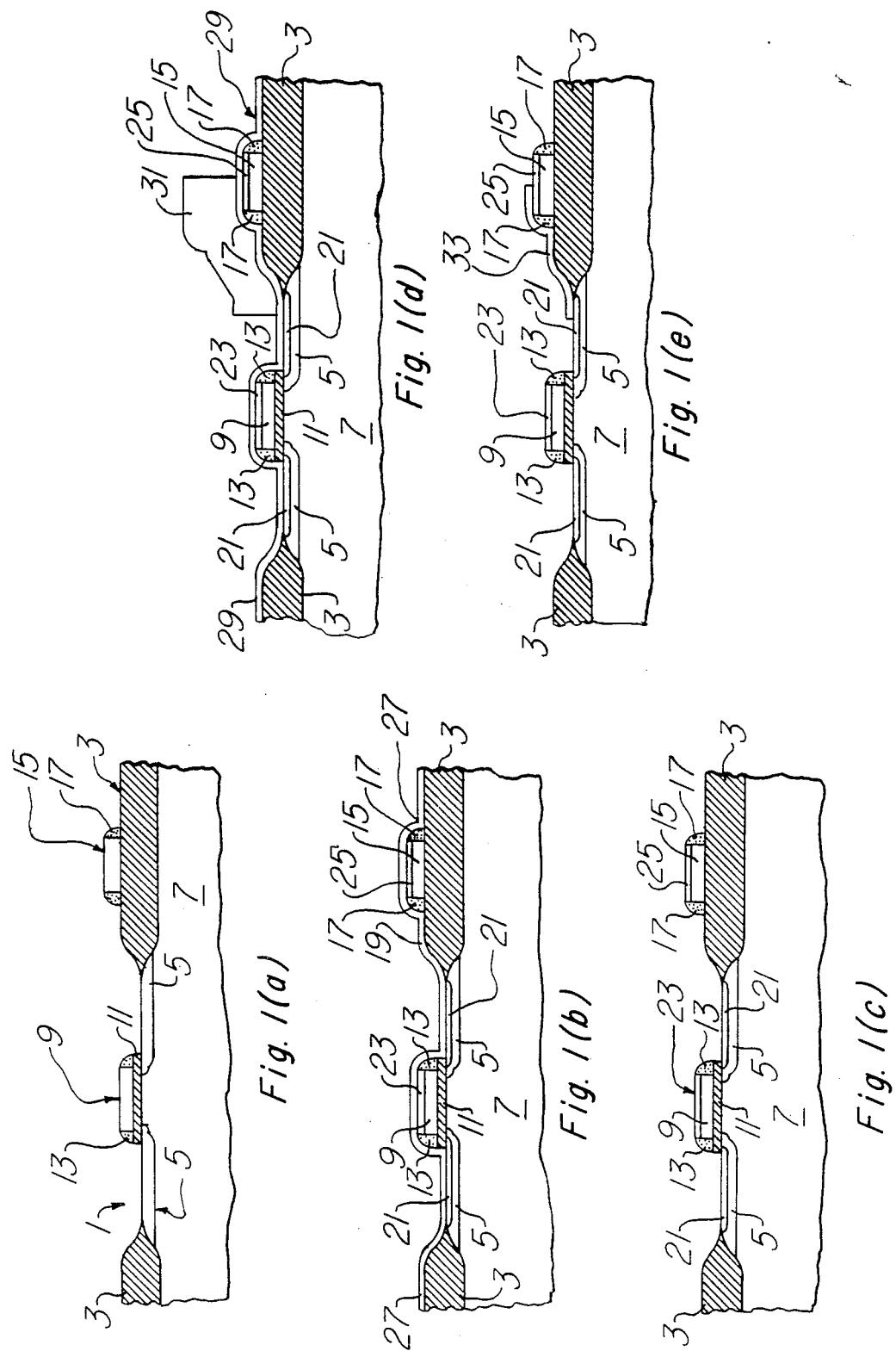

LOCAL INTERCONNECT ETCH TECHNIQUE

CROSS REFERENCE TO PRIOR APPLICATIONS

This invention is an improvement of U.S. Pat. Nos. 4,675,073, 4,793,896 and 4,863,559 and Ser. No. 07/402,944, filed Sept. 5, 1989, all in the name of Monte A. Douglas, the specifications of all of which are incorporated herein by reference.

BACKGROUND OF THE INVENTION

Field of the Invention

Increasing the number of levels of interconnects in integrated circuits provides additional routing capability, more compact layouts, better circuit performance and greater use of circuit design within a given integrated circuit surface area. A particularly useful level of connection is commonly called local interconnection where neighboring diffused areas are connected to one another and to neighboring polysilicon and metal lines.

A conventional method for creating local interconnects uses metal interconnection of diffused regions to one another as well as to other layers. The metal interconnection is formed by etching vias through a thick oxide layer to the locations to be interconnected. A conductor is then formed to fill the vias and make the connection. This method is limited, for purposes of reducing the area required for such connection by the state of the technology of etching contact holes and the planarization of interlevel dielectrics. These limitations include the alignment tolerance of the vias to the underlying region to be connected, the size of the via required (and accordingly the size of the contact area in the underlying region) which can be reliably etched and the step coverage of the conductor filling the via and making good ohmic contact to the underlying region. Also, the additional layer of a metallic conductor across the dielectric contributes to a loss of planarization in subsequent levels.

An alternative method published at page 118 of the 1984 IEDM Proceedings uses additional patterned silicon to provide conductive silicide regions extending over the field oxide as desired. A layer of titanium is deposited over the substrate and, prior to the direct reaction of the titanium with the underlying silicon to form the silicide, a thin layer of silicon is patterned over the titanium metal to define an interconnect extending over a silicon dioxide region separating the two regions to be interconnected. Where this silicon layer remains, a silicide is formed during the reaction process which extends over the oxides. This method requires the deposition and patterning of the additional layer of silicon to define the local interconnection. In addition, the resulting silicide strap provides a conduit through which typical n-type dopants such as phosphorus can diffuse, since titanium silicide is a very poor diffusion barrier to conventional semiconductor dopants. If a silicide strap is used to connect n-type regions to p-type regions, for example n-doped polysilicon to p-type diffusion, subsequent processing must be done at relatively low temperatures to minimize the counterdoping of the p-type region with the type dopant through the silicide interconnect.

Another known method uses molybdenum metal as a local interconnect material. Molybdenum, however, also acts as a diffusion conduit through which phosphorus, used to dope n-type regions of the semiconductor device, can diffuse. The molybdenum interconnect therefore is not an effective local interconnect between n-type and p-type regions because the p-type regions can be undesirably counterdoped by the phosphorus diffusing through the molybdenum, similar to the silicide strap interconnect.

A further local interconnect method is set forth in U.S. Pat. No. 4,675,073 wherein the desired local interconnect is formed by patterning the residual titanium compound, for example titanium nitride, from the direct reaction forming titanium silicide cladding of the diffusions and polysilicon gates. The titanium nitride is sufficiently conductive so that it is useful to make local interconnections between neighboring regions. The disclosed process uses carbon tetrafluoride (CF4) as the reactant in a plasma etch to remove the undesired titanium nitride faster than titanium silicide. This plasma etch using carbon tetrafluoride etches titanium nitride or titanium oxide at approximately twice the rate it remove titanium silicide. This technique also etches silicon oxides at twice the rate and photoresist at five times the rate as it etches titanium nitride or titanium oxide. Additionally, products of the etching process include solids that tend to adhere to the etching device. This requires extra maintenance and cleanup time that is nonproductive.

A still further local interconnect method is set forth in U.S. Pat. Nos. 4,793,896 and 4,863,559 wherein, in accordance with a first feature, a local interconnect is formed on a semiconductor surface by providing a dielectric of a prefabricated integrated circuit which is covered with an electrically conductive chemical compound of a refractory metal, such a compound formed during the silicidation of the refractory metal at locations where it is in contact with tho underlying silicon semiconductor material. A patterned masking material is formed over this chemical compound layer to protect a specific portion thereof. A chlorine bearing agent is used to etch all of tho conductive chemical compound layer except that portion which is protected by the patterned masking material. The chlorine bearing agent etches the conductive chemical compound at a greater rate than the underlying silicide and the dielectric layer. The patterned masking material is removed to expose the protected portion of the electrically conductive material to form a local interconnect on the integrated circuit. In accordance with a second feature, a layer of titanium nitride is formed as a by-product of the formation of titanium silicide by direct reaction, the layer of titanium nitride being present over the titanium silicide layer as well as over insulators such as oxide. A plasma etch using carbon tetrachloride as the etchant is used to etch the titanium nitride anisotropically and selectively relative to the titanium due to the passivation of the titanium silicide surface by the carbon atoms of the carbon tetrachloride. Excess chlorine concentration may be reduced, further reducing the undesired etching of the titanium silicide by providing a consumable power electrode or by introducing chlorine scavenger gases into the reactor. The plasma is ignited by exposing the gases to a mercury/argon light source, thereby photodetaching electrons from the anions in the gas.

Despite the fact that the above described prior art local interconnect methods operate with varying degrees of success, it is always desirable to provide alternate methods for providing local interconnect systems.

SUMMARY OF THE INVENTION

In accordance with the present invention, there is provided a new method for providing local interconnects to titanium and cobalt silicide regions on semiconductor devices.

Briefly, in accordance with the present invention, in the fabrication of a semiconductor device, the local interconnect is formed by first depositing a layer of cobalt or titanium over exposed silicon, such as, for example, source/drain regions, gate regions and other electrically conductive regions. The device is then reacted in standard manner in a nitrogen containing ambient, preferably a combination of nitrogen gas and argon, forming gas or ammonia, to provide cobalt silicide or titanium silicide in the regions where the cobalt or titanium contacts the silicon and elemental cobalt or titanium nitride elsewhere as well as in a layer over the formed silicide. The elemental cobalt (where cobalt is used) is then removed in standard manner as set forth in an article entitled "Characterizatrion of a Self-Aligned Cobalt Silicide Process" by A.E. Morgan et al., *Journal of the Electrochemical Society*, Volume 134, No. 4, pages 925 to 927 (1987) at page 927 in conjunction with FIG. 3 thereof. The titanium nitride is removed in standard manner as described in the above noted U.S. Pat. No. 4,863,559. An electrically conductive film is then formed over the entire device with a material which is selectively etchable by an etchant which does not appreciably etch cobalt silicide or titanium silicide. Some such electricaly conductive materials are set forth in the *Journal of the Electrochemical Society*, Volume 131, No. 10, page 325 (1984). and include TiN, Mo, W, W:Ti, W:Ti(N), W(N), Ta, $TaSi_2$, $MoSi_2$ and $WSi_2$. Photoresist is then patterned over the portion of the electrically conductive film which is to serve as the local interconnect between contact areas, such as, for example, a source/drain and the silicide contact on the gate or a source/drain and the silicide contact area on a polysilicon layer formed on field oxide, and the exposed electrically conductive film is then etched away with an appropriate fluorine-bearing etchant for the film. Such etchants include, but are not limited to $SF_6$, $CF_4$, $NF_3$ and $SiF_4$. The photoresist is then removed in standard manner to provide the device with local interconnect in place. Fabrication of a final semiconductor device is then completed in standard manner.

BRIEF DESCRIPTION OF THE DRAWINGS

FIGS. 1(a) to 1(e) are cross sectional views of a typical semiconductor device at different stages in the process according to the present invention.

DESCRIPTION OF THE PREFERRED EMBODIMENTS

Referring first to FIG. 1(a), there is shown a partially fabricated semiconductor device 1 with field oxide 3 to separate the device 1 from other devices in the same chip. Source/drain regions 5 of the device are shown formed in the silicon substrate 7 with a polysilicon gate electrode 9 disposed between the source/drain regions 5 and spaced from the substrate 7 by an oxide layer 11. A sidewall oxide 13 is also shown over the oxide layer 11 and along the side walls of the gate 9. Also shown over the field oxide 3 is a polysilicon layer 15 having a sidewall oxide 17 thereon. The polysilicon layer 15 can be used as an interconnect to other devices on the chip or to circuitry external of the chip.

As shown in FIG. 1(b), a titanium layer 19 is deposited over the entire device as shown in FIG. 1(a) and, after reaction at a temperature of 650 degrees C. in a nitrogen atmosphere, the layer 19 forms titanium silicide 21 over the source/drain regions 5 and titanium silicide contact regions 23 over the gate 9 and 25 over the layer 15. Titanium nitride 27 is formed at all locations where the titanium layer 19 is not in contact with silicon.

As shown in FIG. 1(c), the titanium nitride is removed by standard Megasonics-agitated $NH_4/H_2O_2/H_2O$ solution. The material is then subjected to an anneal at 700 to 800 degrees C. in an unreactive ambient, such as Ar, $N_2$ or forming gas. Then a layer of electrically conductive material 29 which can be etched by an etchant selective to the material 29 with respect to titanium silicide, for example tungsten, is deposited in standard manner by physical or chemical methods as described in *Solid State Technology*, Oct. 1987 at pages 97 to 103 over the entire substrate surface at a thickness necessary to achieve sufficient conductivity so device performance is not degraded. This layer is patterned with a standard photoresist 31 which covers the interconnect pattern to be achieved in the layer 29 as shown in FIG. 1(d). The layer 29 is then etched with a fluorine-bearing agent in a atmosphere subject to an electrical discharge in standard manner as shown in *Solid State Technology*, Jan. 1985, pages 150 to 158 in the exposed regions to remove all of the layer 29 except the portion thereof masked by the photoresist 31. The photresist is then removed in standard manner to expose the local interconnect pattern 33 as shown in FIG. 1(e). As can be seen, the pattern 33 connects a source/drain region 5 via the titanium silicide contact portion 21 thereon to the titanium silicide contact portion 25 of the polysilicon conductor 15 by travelling over the field oxide 3 and the sidewall oxide 17.

The above described procedure can be used in the case where the titanium deposition described with respect to FIG. 1(b) and in *Solid State Technology*, Oct. 1987, pages 97 to 103 is replaced by the deposition of cobalt. The entire procedure described above will be repeated except that cobalt silicide will be formed in place of the above described titanium silicide and the cobalt which is not disposed over silicon during reaction will remain as elemental cobalt rather than being converted to the nitride as was the case with titanium. Accordingly, the above described step of removing the titanium nitride is replaced by the step of removing elemental cobalt. The cobalt etch chemistry described in the above noted article from the Journal of the Electrochemical Society of Oct., 1987.

Though the invention has been described with respect to specific preferred embodiments thereof, many variations and modification will immediately become apparent to those skilled in the art. It is therefore the intention that the appended claims be interpreted as broadly as possible in view of the prior art to include all such variations and modifications.

I claim:

1. A method of forming an electrically conductive interconnect comprising the steps of:
   (a) providing a silicon semiconductor surface having regions of exposed silicon and regions of dielectric thereon;
   (b) forming a layer taken from the class consisting of cobalt and titanium over said surface;

(c) reacting said layer with said exposed silicon to form a silicide therewith;
(d) removing the non-silicided portion of said layer;
(e) forming a layer of electrically conductive material over said surface;
(f) forming a mask over predetermined portions of said layer of electrically conductive material;
(g) removing the unmasked portion of said layer of electrically conductive material; and
(h) removing said mask.

2. The method according to claim 1 wherein said electrically conductive material is taken from the class consisting of such materials that form volatile fluoride compounds at about 25 degrees C.

3. The method of claim 1 wherein said mask extends between two electrically isolated ones of the silicided portions of said layer.

4. The method of claim 2 wherein said mask extends between two electrically isolated ones of the silicided portions of said layer.

5. The method of claim 1 wherein said mask extends between a said silicide portion of said layer and an electrical conductor electrically isolated from said silicided portion.

6. The method of claim 2 wherein said mask extends between a said silicide portion of said layer and an electrical conductor electrically isolated from said silicided portion.

7. The method of claim 1 wherein said step of removing the unmasked portion of said layer of electrically conductive material comprises etching said unmasked portion with a fluorine based etchant with selectivity to said silicide.

8. The method of claim 2 wherein said step of removing the unmasked portion of said layer of electrically conductive material comprises etching said unmasked portion with a fluorine based etchant with selectivity to said silicide.

9. The method of claim 3 wherein said step of removing the unmasked portion of said layer of electrically conductive material comprises etching said unmasked portion with a fluorine based etchant with selectivity to said silicide.

10. The method of claim 4 wherein said step of removing the unmasked portion of said layer of electrically conductive material comprises etching said unmasked portion with a fluorine based etchant with selectivity to said silicide.

11. The method of claim 5 wherein said step of removing the unmasked portion of said layer of electrically conductive material comprises etching said unmasked portion with a fluorine based etchant with selectivity to said silicide.

12. The method of claim 6 wherein said step of removing the unmasked portion of said layer of electrically conductive material comprises etching said unmasked portion with a fluorine based etchant with selectivity to said silicide.

* * * * *

UNITED STATES PATENT AND TRADEMARK OFFICE
CERTIFICATE OF CORRECTION

PATENT NO. : 4,980,020

DATED : Dec. 25, 1990

INVENTOR(S) : Monte A. Douglas

It is certified that error appears in the above-identified patent and that said Letters Patent is hereby corrected as shown below:

On the title page please change "[22] Filed: Jan. 22, 1989" to read --[22] Filed: Dec. 22, 1989--.

Signed and Sealed this

Thirtieth Day of June, 1992

*Attest:*

DOUGLAS B. COMER

*Attesting Officer*     *Acting Commissioner of Patents and Trademarks*